(12) United States Patent
Sung et al.

(10) Patent No.: US 9,806,254 B2
(45) Date of Patent: Oct. 31, 2017

(54) STORAGE DEVICE WITH COMPOSITE SPACER AND METHOD FOR MANUFACTURING THE SAME

(71) Applicant: TAIWAN SEMICONDUCTOR MANUFACTURING CO., LTD., Hsinchu (TW)

(72) Inventors: Fu-Ting Sung, Taoyuan (TW); Chern-Yow Hsu, Chu Bei (TW); Shih-Chang Liu, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/740,101

(22) Filed: Jun. 15, 2015

(65) Prior Publication Data

US 2016/0365513 A1    Dec. 15, 2016

(51) Int. Cl.
  *H01L 21/311*    (2006.01)
  *H01L 45/00*    (2006.01)
  *H01L 43/12*    (2006.01)

(52) U.S. Cl.
  CPC .............. *H01L 45/08* (2013.01); *H01L 43/12* (2013.01); *H01L 45/04* (2013.01); *H01L 45/12* (2013.01); *H01L 45/1233* (2013.01); *H01L 45/16* (2013.01); *H01L 45/1675* (2013.01)

(58) Field of Classification Search
  CPC ..... H01L 45/06; H01L 45/14; H01L 27/2481; H01L 27/249; H01L 23/528; H01L 21/311; H01L 21/31105; H01L 21/31111; H01L 21/31116; H01L 21/32134; H01L 21/67023; H01L 21/306–21/30655; H01L 21/47573; H01L 21/823468; H01L 21/823864; H01L 29/66553; H01L 29/6656; H01L 29/66689; H01L 29/66719; H01L 2224/85931; H01L 2224/86031; H01L 2224/27612; H01L 27/222–27/228; H01L 45/145–45/147; H01L 45/08–45/085; H01L 45/16–45/1691
  USPC .............................................. 438/184; 257/4
  See application file for complete search history.

(56) References Cited

U.S. PATENT DOCUMENTS

| 6,001,538 A  * | 12/1999 | Chen ................. H01L 21/76804 216/41 |
| 6,383,878 B1 * | 5/2002 | Huang .............. H01L 21/76897 257/E21.438 |
| 2005/0064635 A1* | 3/2005 | Ajmera ............. H01L 21/02063 438/184 |
| 2005/0247975 A1* | 11/2005 | Kim .................. H01L 21/26586 257/336 |
| 2008/0265322 A1* | 10/2008 | Lin ................... H01L 21/28079 257/347 |

(Continued)

*Primary Examiner* — Natalia Gondarenko
(74) *Attorney, Agent, or Firm* — Maschoff Brennan

(57) ABSTRACT

A storage device includes a first electrode, a second electrode, a storage element, a spacer and a barrier structure. The second electrode is opposite to the first electrode. The storage element is disposed between the first electrode and the second electrode. The spacer is formed on a sidewall of the second electrode, and the spacer has a notch positioned on a top surface of the spacer. The barrier structure is embedded in a lateral of the spacer, and the barrier structure has a top extending upwards past a bottom of the notch. In addition, a method of manufacturing the storage device is disclosed as well.

18 Claims, 16 Drawing Sheets

(56) References Cited

U.S. PATENT DOCUMENTS

| | | | |
|---|---|---|---|
| 2009/0108415 A1* | 4/2009 | Lenski | H01L 29/6653 257/649 |
| 2012/0001145 A1* | 1/2012 | Magistretti | H01L 27/2445 257/4 |
| 2014/0070162 A1* | 3/2014 | Iwayama | H01L 43/08 257/4 |
| 2014/0191301 A1* | 7/2014 | He | H01L 21/02167 257/288 |
| 2014/0258626 A1* | 9/2014 | Kang | H01L 45/1253 711/125 |
| 2015/0243708 A1* | 8/2015 | Ravasio | H01L 27/2463 257/4 |

* cited by examiner

STORAGE DEVICE WITH COMPOSITE SPACER AND METHOD FOR MANUFACTURING THE SAME

BACKGROUND

Semiconductor products are used in a variety of electronic application, such as person computers, cell phones, digital cameras, and other electronic equipments. For instance, memory devices such as random-access memories (RAM) are necessarily used in many electronic devices. The semiconductor integrated circuit (IC) industry has experienced rapid growth. Technological progress in IC manufacture has produced several generations of ICs, and each generation fabricates smaller and more complex circuits than the previous generation. Several advanced techniques have been developed to implement technique nodes with smaller feature sizes, and these techniques are employed in the manufacturing of the storage devices, for example. However, while the feature size is smaller than a certain dimension, some processes have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
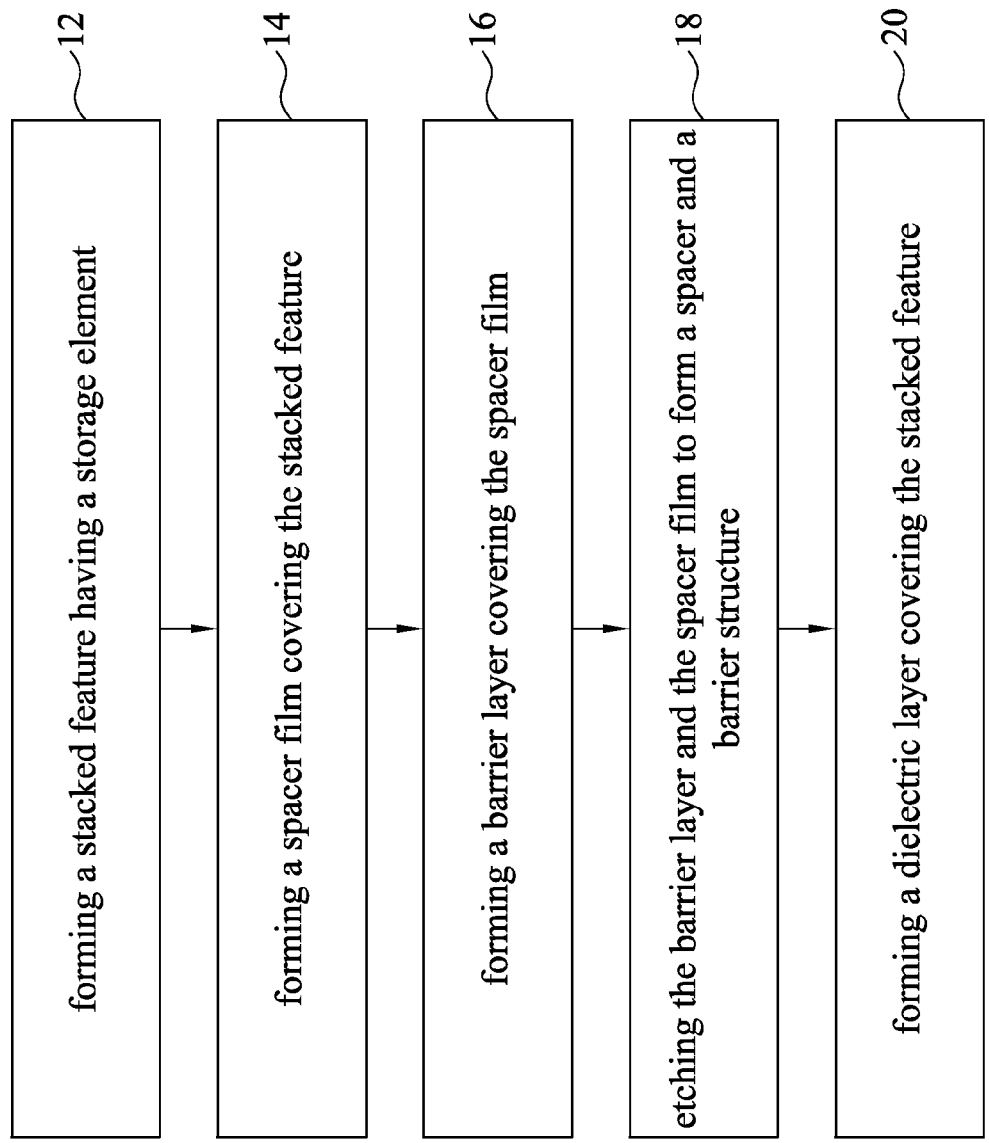
FIG. 1 is a flow chart illustrating a method of forming a storage device according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The semiconductor industry has continually improved the speed and power of integrated circuits (ICs) by reducing the size of components within the ICs. Several advanced techniques have been developed to implement technique nodes with smaller feature sizes, and these techniques are employed in the manufacturing of the storage devices, for example. However, while the feature size is smaller than a certain dimension such as for example about 40 nm (i.e. technique node 40) or less, some processes suffer from misalignment and overlay problems that degrade device performance and decrease the manufacture yield. Accordingly, one of the aspects of the present disclosure is to provide a solution to the misalignment problems.

The present disclosure relates generally to a semiconductor device such as for example a storage device and a method of manufacturing the storage device. In examples, the storage device may be, for example, a magnetoresistive random-access memory (MRAM), resistive random-access memory (RRAM), conductive-bridging random-access memory (CBRAM) or the like. According to various embodiments of the present disclosure, the semiconductor device or the storage device has a composite spacer with a shape that is different from the spacer in typical semiconductor devices. Various embodiments of the present disclosure will be described in detail hereinafter.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIG. 1 is a flow chart illustrating a method 10 of forming a storage device according to various embodiments of the present disclosure. The method 10 includes operation 12, operation 14, operation 16, operation 18 and operation 20. FIGS. 3-15 collectively illustrate more detailed manufacturing methods as a series of cross-sectional views in accordance with various embodiments of the present disclosure. It will be appreciated that although these methods each illustrate a number of operations, acts and/or features, not all of these operations, acts and/or features are necessarily required, and other un-illustrated operations, acts and/or features may also be present. Also, the ordering of the operations and/or acts in some embodiments can vary from what is illustrated in these figures. In addition, the illustrated acts can be further divided into sub-acts in some implementations, while in other implementations some of the illustrated acts can be carried out concurrently with one another.

Figure 2:
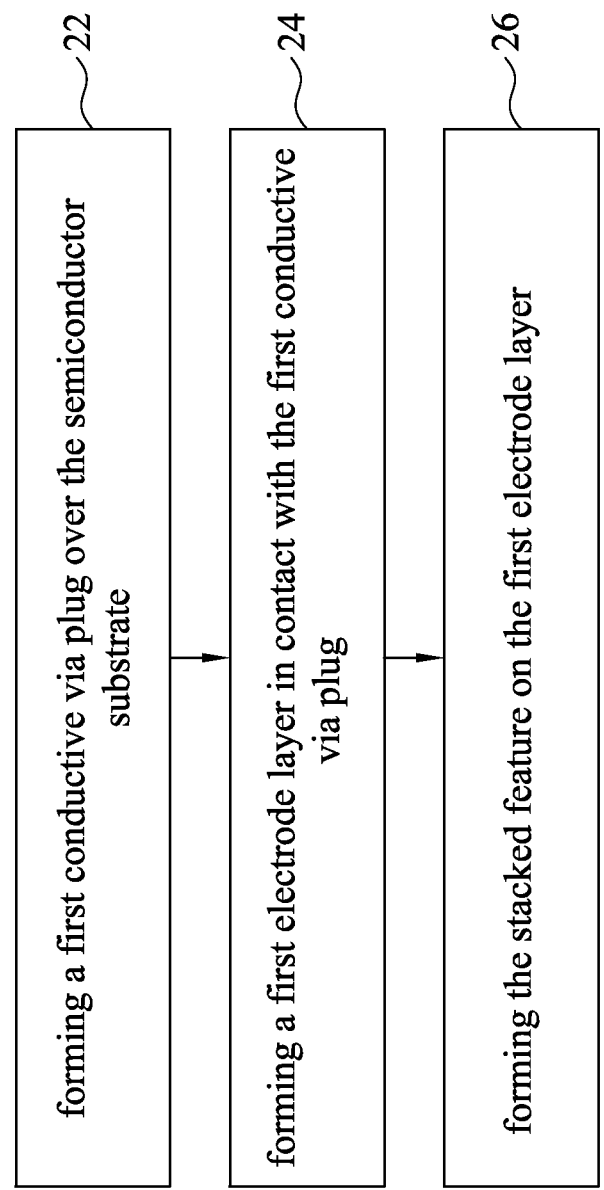
FIG. 2 illustrating an approach to implement the operation 12 in a flowchart format according to some embodiments of the present disclosure.

Referring to operation 12 of FIG. 1, a stacked feature having a storage element is formed over a semiconductor substrate. FIG. 2 illustrating an approach to implement the operation 12 in a flowchart format according to some embodiments of the present disclosure. As shown in FIG. 2, the operation 12 includes act 22, act 24 and act 26. In addition, FIGS. 3-9 depict cross-sectional views at various fabrication stages in the operation 12 according to some embodiments of the present disclosure. It should be noted that the fabrication stages as well as the features in connection with FIGS. 3-9 are merely examples. A person skilled in the art will recognize there may be many alternatives, variations and modifications.

Figure 3:
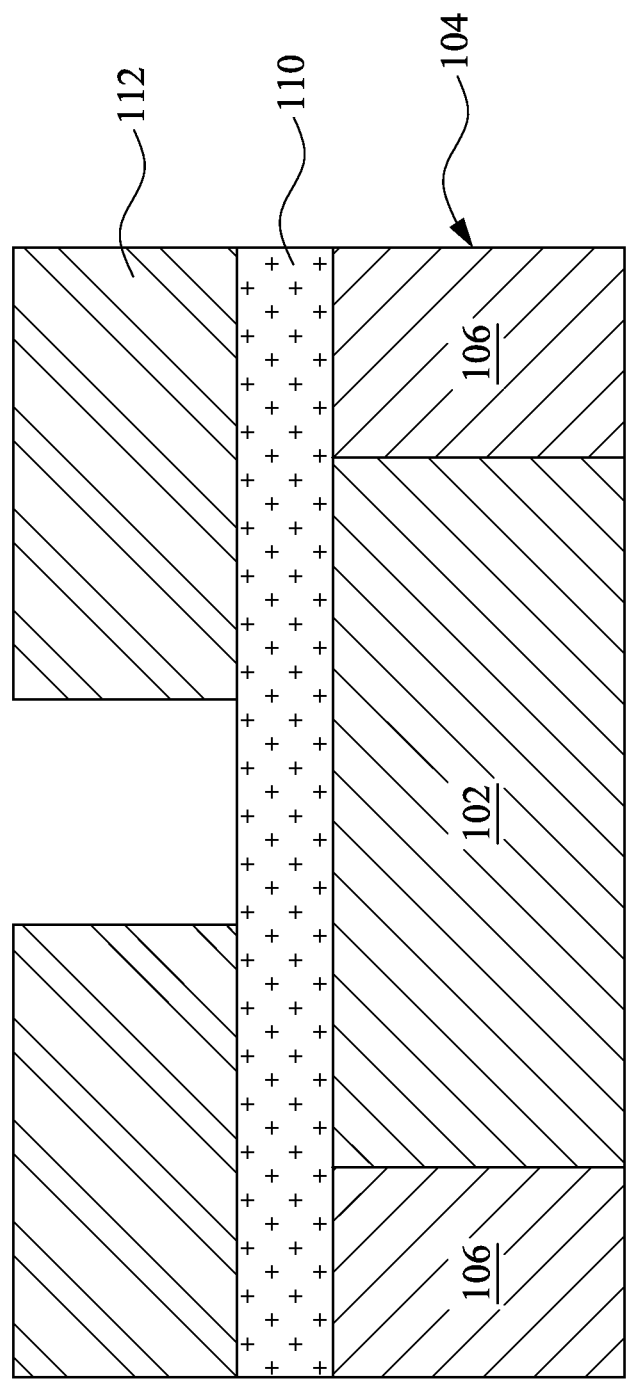
FIGS. 3-15 are cross-sectional views schematically illustrating a method of forming a storage device in various process stages according to various embodiment of the present disclosure.
Figure 4:
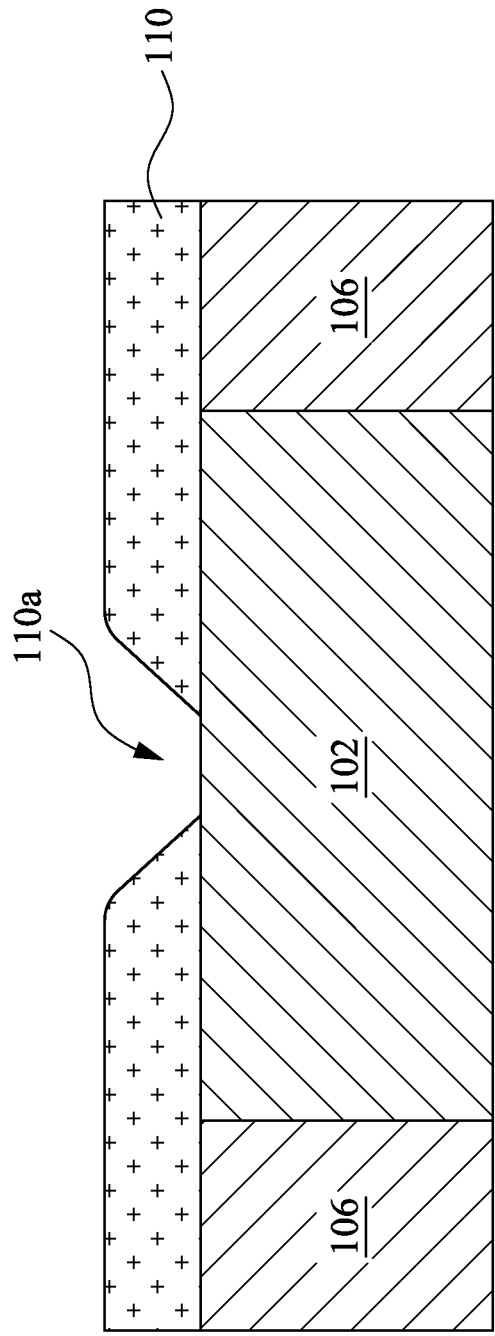

In act 22, a first conductive via plug 102 is formed on the semiconductor substrate 104, as illustrated in FIG. 3. In some embodiments, the semiconductor substrate 104 may include a dielectric layer 106, and the first conductive via plug 102 is formed in the dielectric layer 106. The dielectric layer 106 may include polybenzoxazole (PBO), polyimide, benzocyclobutene (BCB), phosphosilicate glass (PSG), borosilicate glass (BSG), boron-doped phosphosilicate glass (BPSG), silicon nitride, silicon oxide, any combinations thereof and/or the like. The dielectric layer 210 may be formed by many suitable approaches such as spinning coating, chemical vapor deposition (CVD), and plasma enhanced CVD (PECVD) and/or the like. The semiconductor substrate 104 may include, for example, bulk silicon, doped or undoped, or an active layer of a semiconductor-on-insulator (SOI) substrate. Other substrates, such as a multi-layered or gradient substrate may also be used. In some embodiments, write word lines and/or read word lines (not shown) may be formed under the first conductive via plug 102 and the dielectric layer 106. Further, one of more transistors (not shown) may be formed under the first conductive via plug 102 and the dielectric layer 106 in the semiconductor substrate 104, and the transistors are electrically connected to the first conductive via plug 102 through the write word lines and/or read word lines.

In act 24, a first electrode layer is formed over and in contact with the first conductive via plug 102, as illustrated in FIGS. 3-6. In some embodiments, before the first electrode layer is formed, a first dielectric layer 110 is deposited over the semiconductor substrate 104 as shown in FIG. 3. The first dielectric layer 110 may include silicon nitride (SiN), silicon carbide (SiC), silicon oxy-nitride (SiON), or nitrogen-free anti-reflective coating (NFARC) material such as for example SiCO and SiCOH, or the like or the combination thereof. The first dielectric layer 110 may be formed by suitable approaches such as chemical vapor deposition (CVD), plasma enhanced CVD (PECVD), spinning coating and/or the like. The first dielectric layer 110 may be patterned using a mask layer 112 such that an aperture 110a is formed in the first dielectric layer 110, as illustrate in FIG. 4. The aperture 110a exposes at least a portion of the first conductive via plug 102 according to some examples of the present disclosure.

Figure 5:
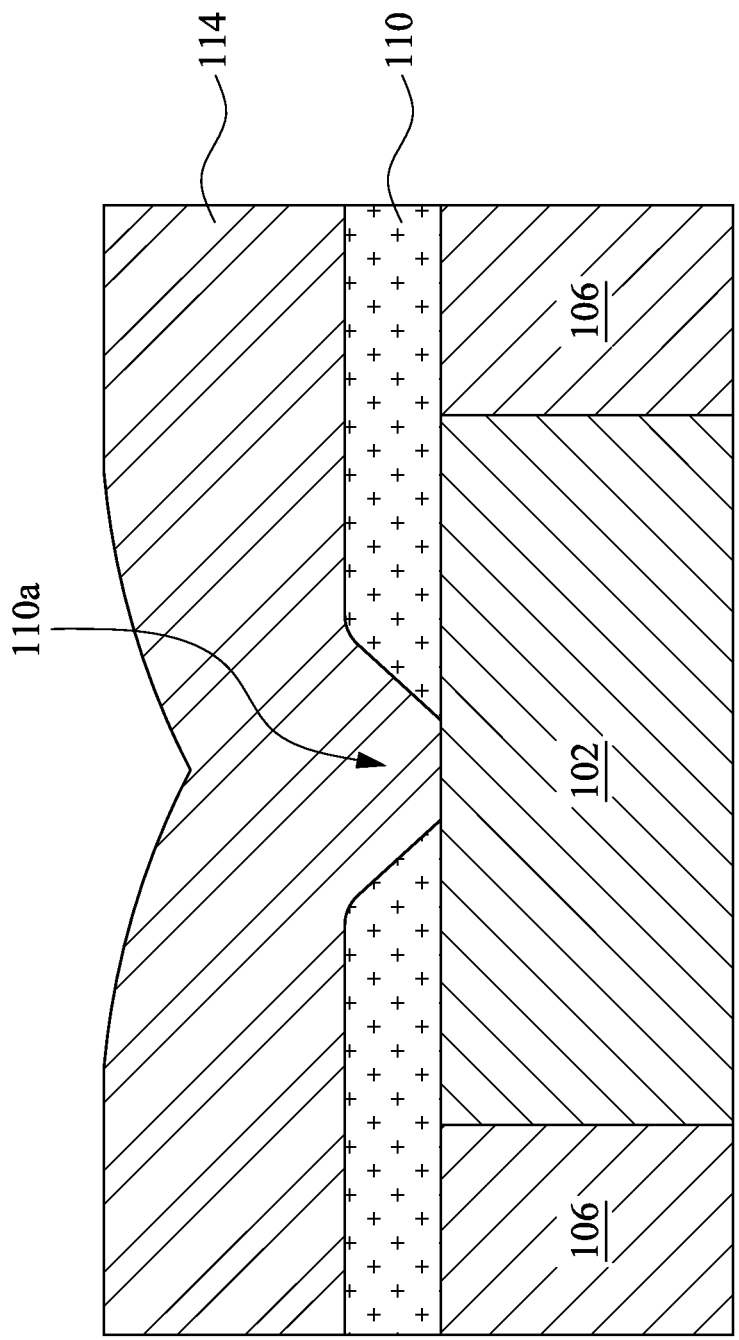
Figure 6:
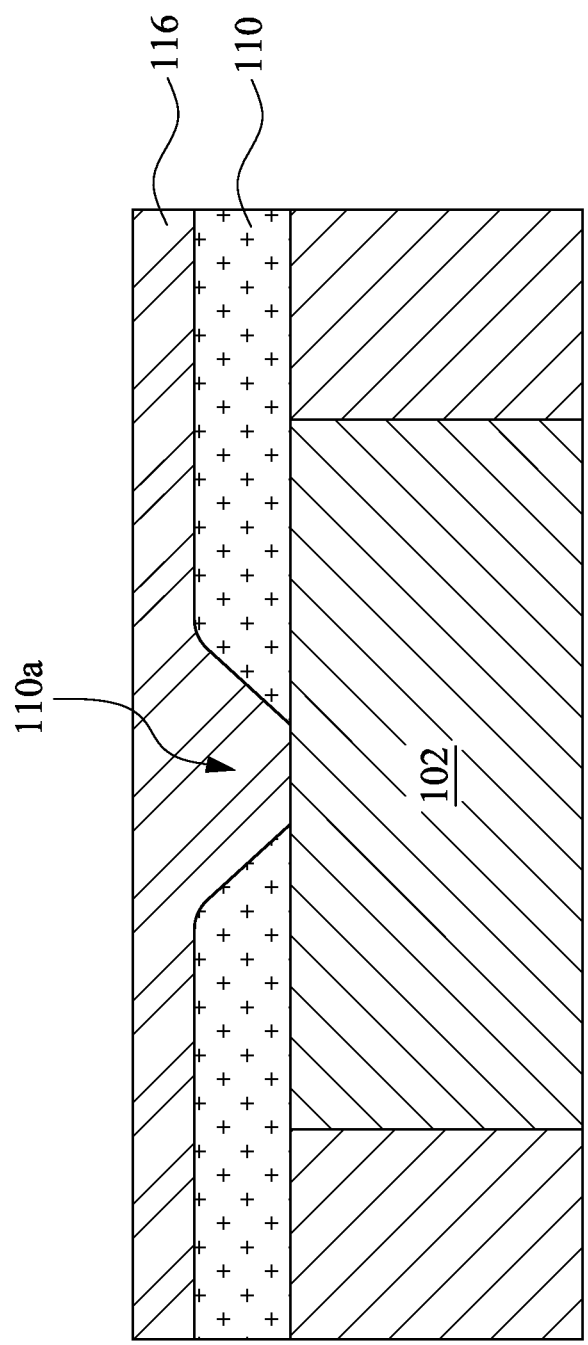

In FIG. 5, a conductive material layer 114 is deposited on the first dielectric layer 110. The conductive material layer 114 covers the first dielectric layer 110 and fills the aperture 110a. Thereafter, a planarization process, such as for example a chemical-mechanical polishing (CMP) process, is performed on the conductive material layer 114 so as to form the first electrode layer 116, as shown in FIG. 6. The first electrode layer 116 is in contact with the first conductive via plug 102 through the aperture 110a. The first electrode layer 116 may include Ti, Ta, TiN, TaN, or other suitable metals or materials, and may be formed by physical vapor deposition processes, chemical vapor deposition processes or other suitable methods.

Figure 7:
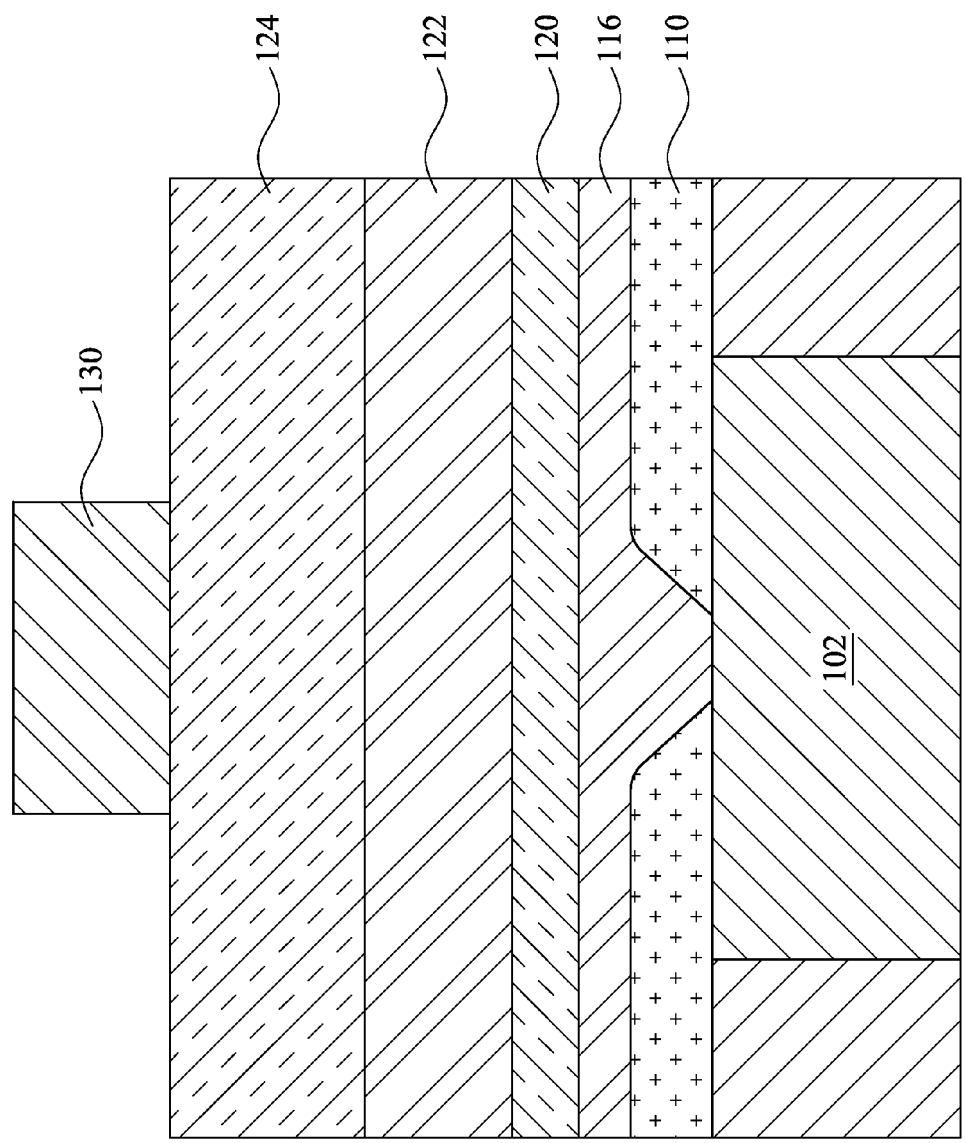
Figure 8:
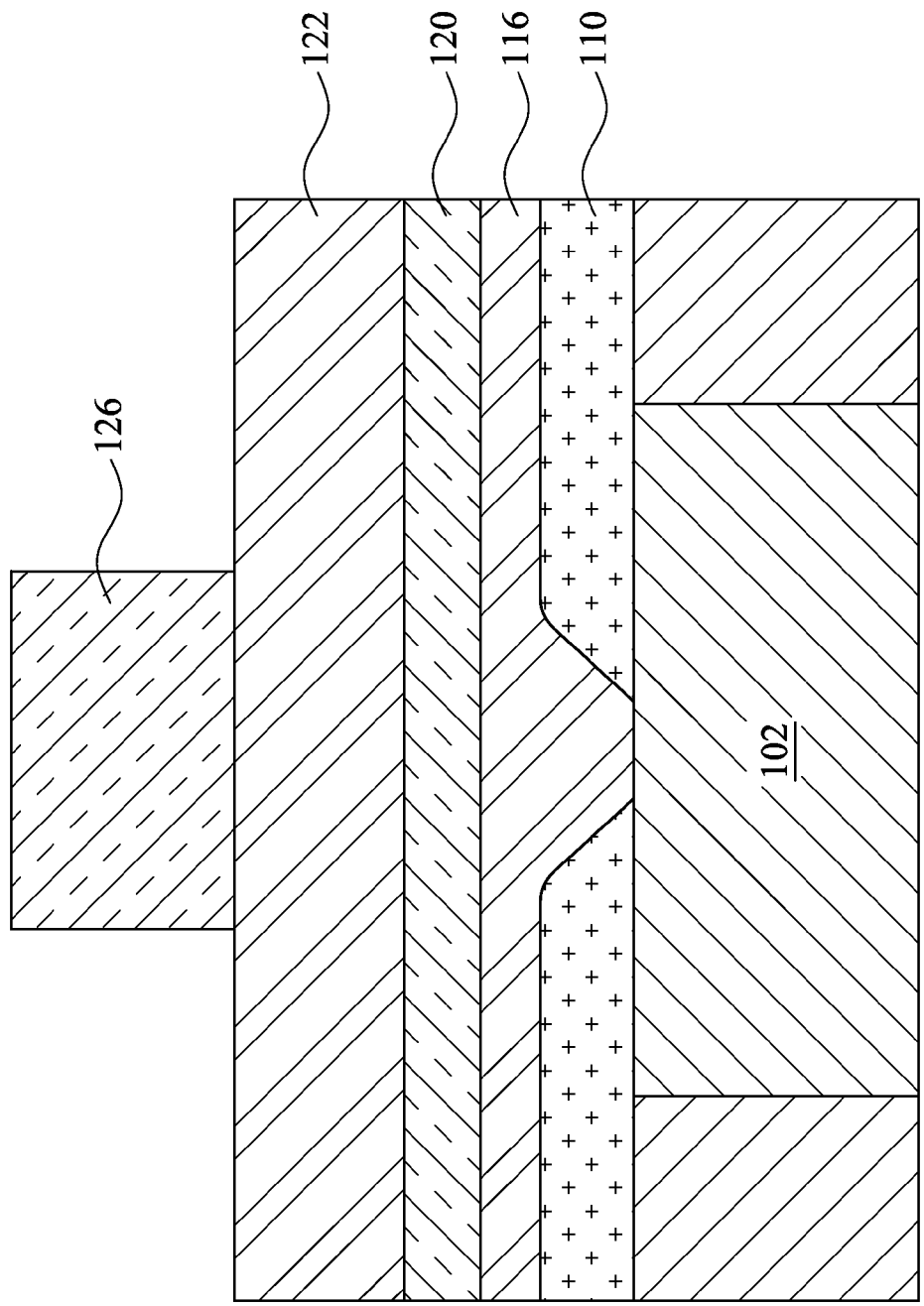
Figure 9:
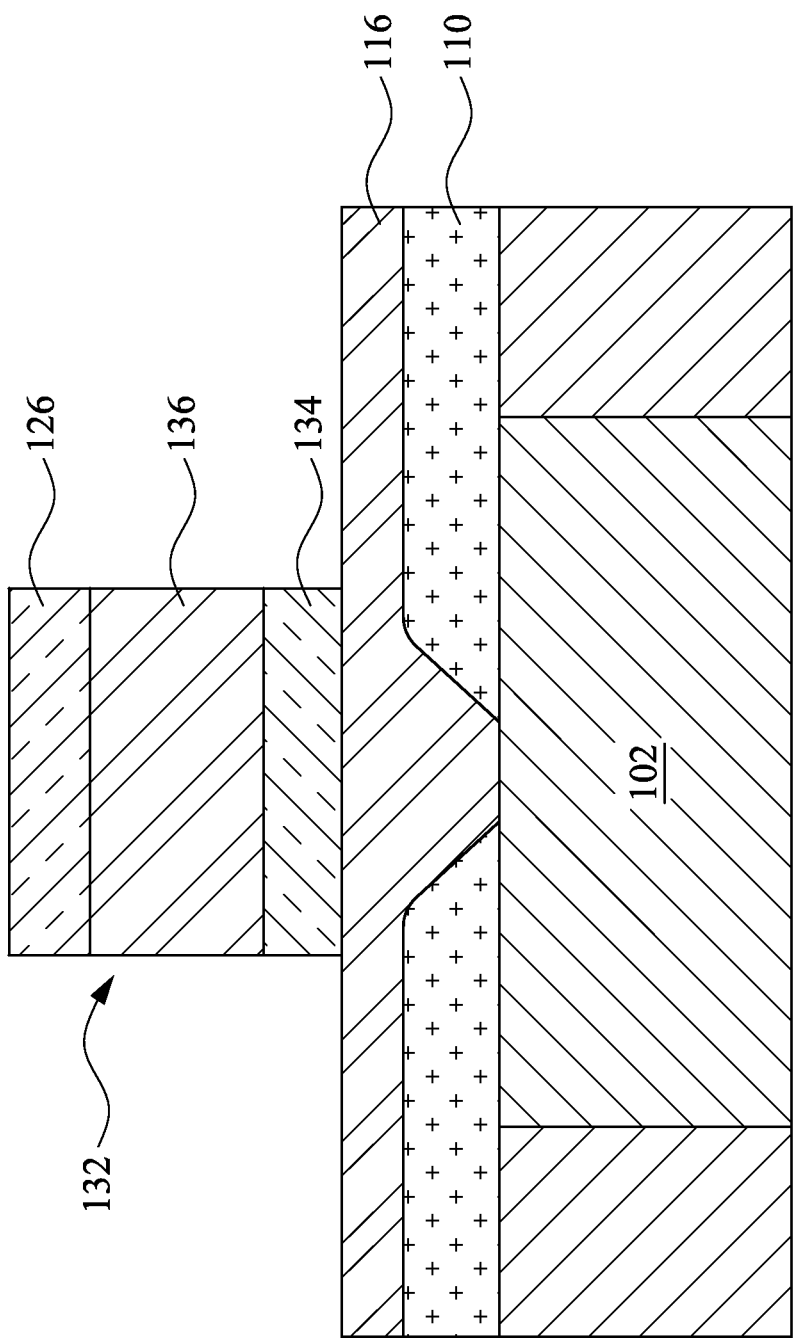

In act 26, the stacked feature is formed on the first electrode layer 116, as illustrated in FIGS. 7-9. Referring to FIG. 7, a storage material layer 120 is formed overlaying the first electrode layer 116, and subsequently a second electrode layer 122 is formed overlaying the storage material layer 120 according to various embodiments of the present disclosure. In some embodiments, the storage material layer 120 may include multiple layers. For example, the storage material layer 120 may include a magnetic tunnel junction (MTJ) stack having a free synthetic antiferromagnetic ("SAF") layer (not shown), a pinned SAF layer (not shown) and a tunnel barrier layer (not shown) interposed there between. Further, the free SAF layer may include a plurality of ferromagnetic layers (not shown) and at least one antiferromagnetic coupling spacer layers (not shown) interposed between two adjacent ones of the ferromagnetic layers. The pinned SAF layer may include a pinned ferromagnetic layer (not shown), a fixed ferromagnetic layer (not shown) and an antiferromagnetic coupling spacer layer (not shown) interposed there between. The materials for the tunnel barrier layer may include electrically insulating materials that form a tunneling junction. Examples of such materials include MgO, AlN, TaN, and/or $Ta_2O_5$. In some examples, the MTJ stack includes Co, Fe, B, Ni, Mg, Mo, or Ru, or the like, or a combination thereof. MTJ stack can be manufactured by thin film technologies, such as magnetron sputter deposition, molecular beam epitaxy, pulsed laser deposition, electron beam physical vapor deposition, or any other suitable methods.

In some embodiments, the storage material layer 120 may include materials used in RRAMs or CBRAMs. For example, the storage material layer 120 may include $Ge_2Sb_2Te_5$, AgInSbTe, NiO, $TiO_2$, $Sr(Zr)TiO_3$, GeS, GeSe, $Cu_2S$, or the like, or a combination thereof.

The second electrode layer 122 may include Ti, Ta, TiN, TaN, or other suitable metals, and may be formed by physical vapor deposition processes, chemical vapor deposition processes or other suitable methods. The material of the second electrode layer 122 may be the same as or different from that of the first electrode layer 116.

Thereafter, a hard mask layer 124 is deposited on the second electrode layer 122, and followed by lithography and etching processes to form a patterned mask layer 126, as shown in FIG. 8. In specifics, a patterned photoresist layer 130 may be formed on the hard mask layer 124, and then the hard mask layer 124 is etched to form the patterned mask layer 126.

In FIG. 9, a patterning process is carried out on the storage material layer 120 and the second electrode layer 122 using the patterned mask layer 126 so as to form the stacked feature 132 including a storage element 134 and a second electrode 136. In some embodiments, the stacked feature 132 includes a remained portion of the patterned mask layer 126 located on the second electrode 136. The storage material layer 120 and the second electrode layer 122 may be patterned by any suitable etching techniques such as for example dry plasma etching process and reactive ion etching (RIE) techniques.

The acts 22, 24 and 26 illustrated in FIG. 2 provides approaches to implement the operation 12 of forming the stacked feature 132, which at least includes the storage element 134 according to various embodiments of the present disclosure. In some embodiments, the stacked feature 132 further includes the second electrode 136 stacked on the storage element 134. In yet some embodiments, the storage element 134 and second electrode 136 have an identical pattern.

Figure 10:
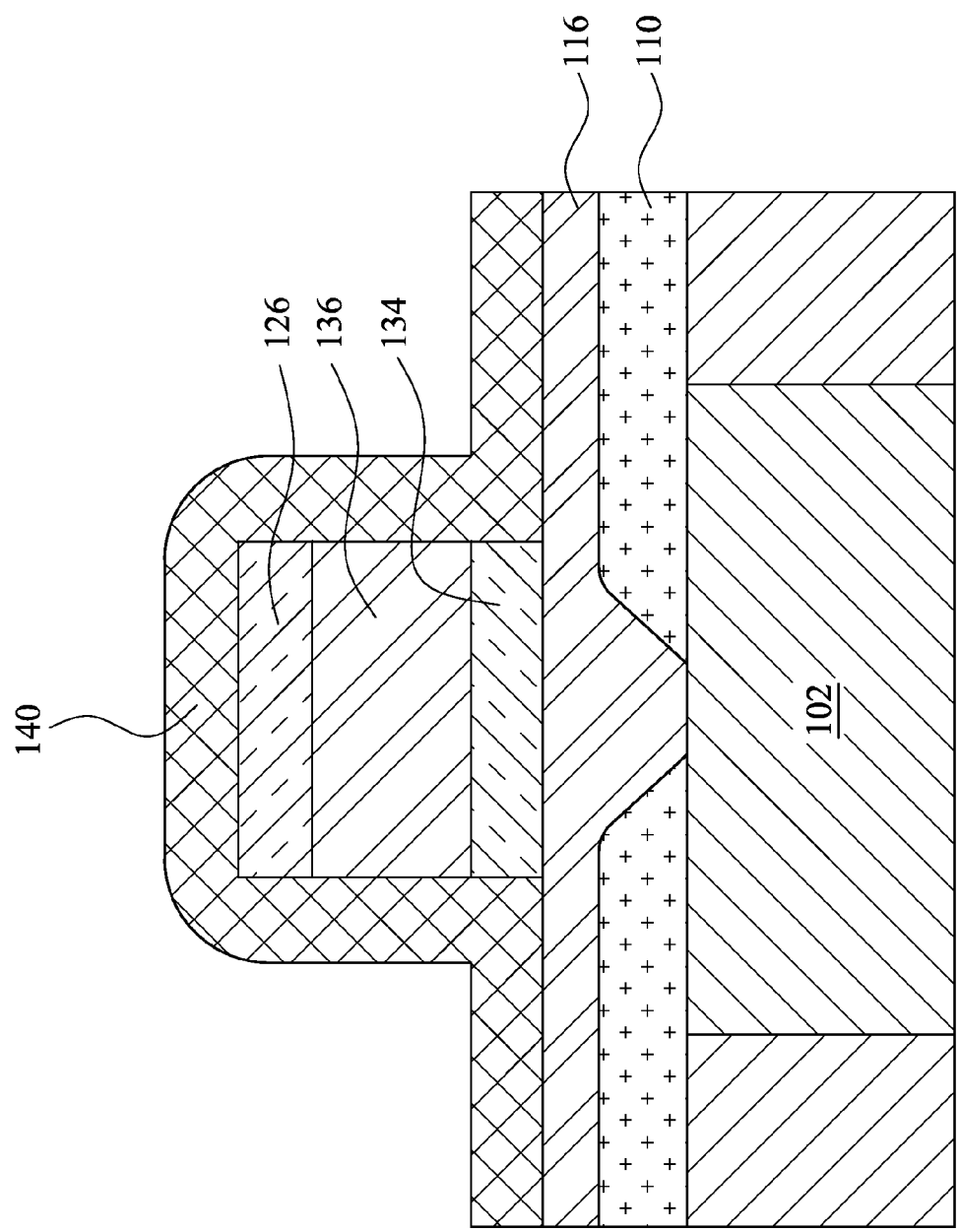

Turning to operation 14 in FIG. 1, a spacer film 140 is formed to cover the stacked feature 132, as shown in FIG. 10. In some embodiments, the spacer film 140 may include silicon nitride (SiN), silicon carbide (SiC), silicon oxynitride (SiON), or nitrogen-free anti-reflective coating (NF ARC) material such as for example SiCO and SiCOH, or the like or a combination thereof, and the spacer film 140 may be formed by any suitable approach such as chemical vapor deposition (CVD), plasma enhanced CVD (PECVD), spinning coating and/or the like. In some embodiments, the thickness of the spacer film 140 may be about 15 nm to about 100 nm, specifically about 25 nm to about 80 nm, more specifically about 30 nm to about 60 nm. In addition, according to some examples of this disclosure, the spacer film 140 is conformally deposited over the stacked feature 132 that includes the storage element 134, the second electrode 136 and the remained patterned mask layer 126.

Figure 11:
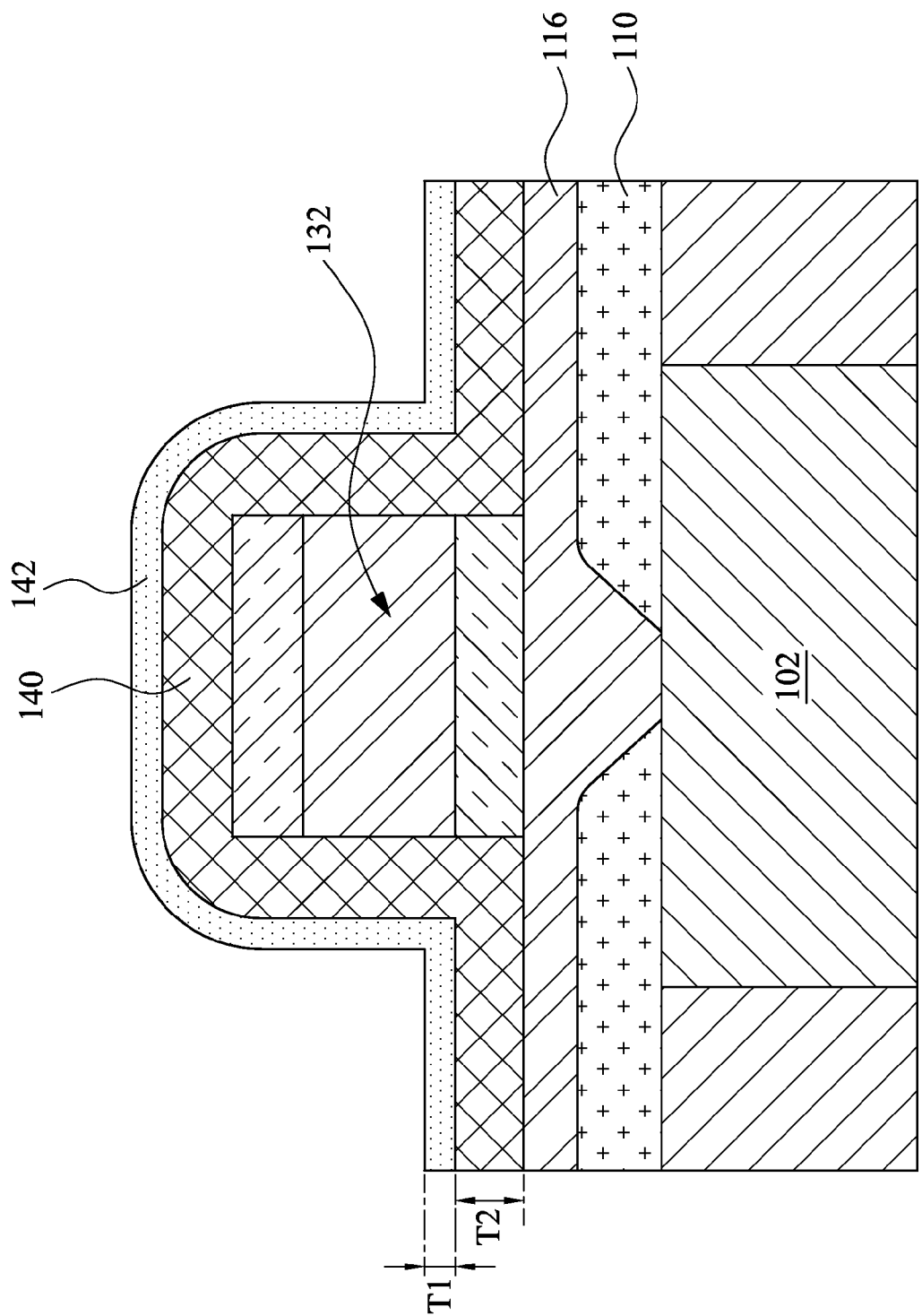

In operation 16, a barrier layer 142 is formed to cover the spacer film 140, as shown in FIG. 11. In some embodiments, the etching resistance of the material constituting the barrier layer 142 is greater than that of the material constituting the spacer film 140. In examples, the barrier layer 142 may include undoped silica glass (USG), fluorine silica glass (FSG), tetraethyl orthosilicate (TEOS)-based oxide, or the like, or a combination thereof. In yet some embodiments, the thickness T1 of the barrier layer 142 is approximately 5-35% of the thickness T2 of the spacer film 140, specifically approximately 10-30% of the thickness T2. In some examples, when the thickness T1 of the barrier layer 142 is greater than a certain value such as for example 35% of the thickness T2, it is unfavorable to the subsequent operation 18. In contrast, when the thickness T1 of the barrier layer 142 is less than a certain value such as for example 5% of the thickness T2, the barrier layer 142 may be insufficient to control the shape of certain features in the subsequent operation 18, and this is described in detail hereinafter. In some examples, the thickness T1 of the barrier layer 142 may be about 5 nm to about 30 nm, specifically about 7 nm to about 20 nm, more specifically about 8 nm to about 15 nm.

Figure 12:
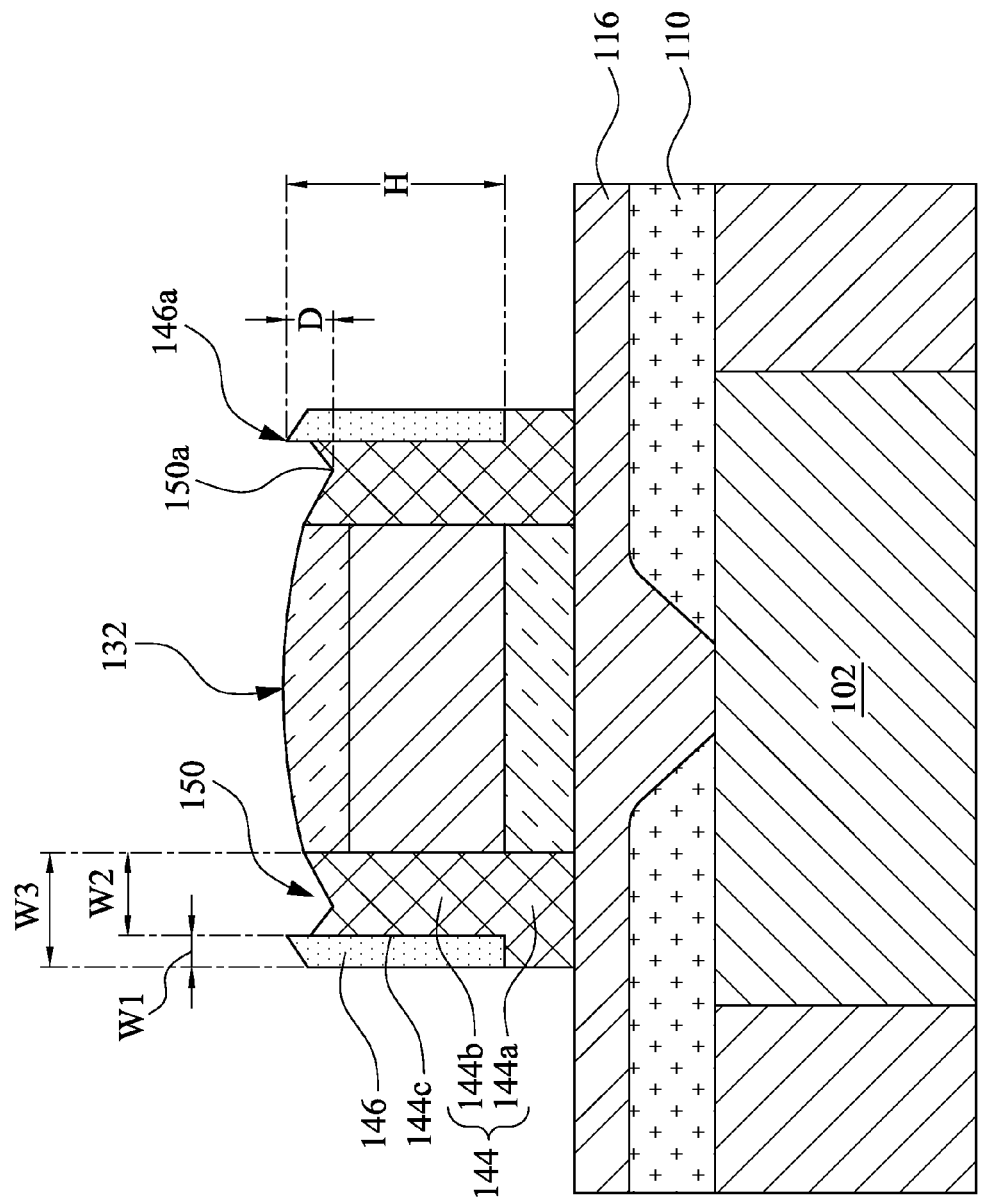

In operation 18, an etching process is performed on the barrier layer 142 and the spacer film 140 using an etchant so as to form a spacer 144 and a barrier structure 146, as shown in FIG. 12. The spacer 144 is positioned on the sidewall of the stacked feature 132, and further the barrier structure 146 is embedded in a lateral 144c of the spacer 144. In some embodiments, the etching process in operation 18 is a dry etching process, in which no photoresist layer is provide on the barrier layer 142, and therefore the barrier layer 142 and the spacer film 140 are etched in a comprehensive manner. Furthermore, because the etching resistance to the etchant of the barrier layer 142 is greater than that of the spacer film 140, the obtained spacer 144 and barrier structure 146 have a particular shape. Particularly, a notch 150 is formed on a top surface of the spacer 144, and the obtained spacer 144 has a sufficient thickness since the barrier layer 142 restrains the etching exerted on the lateral 144c of the spacer 144. The spacer 144 and the barrier layer 142 constitute a composite spacer on the sidewall the stacked feature 132.

In some embodiments, the spacer 144 includes a bottom portion 144a and a standing portion 144b extending upwards from the bottom portion 144a, and the width W3 of the bottom portion 144a is greater than the width W2 of the standing portion 144b. In some embodiments, the barrier structure 146 stands on the bottom portion 144a and in contact with the lateral 144c of the standing portion 144b.

In yet some embodiments, the operation 18 of etching the barrier layer 142 and the spacer film 140 further constitutes a taper top 146a of the barrier structure 146, as shown in FIG. 12. In some examples, the notch 150 of the spacer 144 has a bottom 150a positioned at a level below the taper top 146a of the barrier structure 146. In yet some examples, the distance D between the taper top 146a and the bottom 150a of the notch 150 defines the depth D of the notch 150, and the depth D of the notch 150 is approximately 3-30% of the height H of the barrier structure 146. For example, the depth D is approximately 3-15% of the height H, or approximately 10-30% of the height H.

In yet some embodiments, the width W1 of the barrier structure 146 is approximately 5-35% of the width W2 of the standing portion 144b of the spacer 144, specifically approximately 10-30% of the width W2.

The etching rate of the spacer film 140 is at least 8 folds of that of the barrier layer 142 in the operation 18 according to various embodiments of the present disclosure. In some examples, the etchant used in the operation 18 includes halogen. In yet some examples, the etchant includes F, Cl and Br. In yet some examples, the etchant includes at least one of $CH_2F_2$, $CF_4$, HBr, $Cl_2$, or the like, or a mixture thereof.

Figure 13:
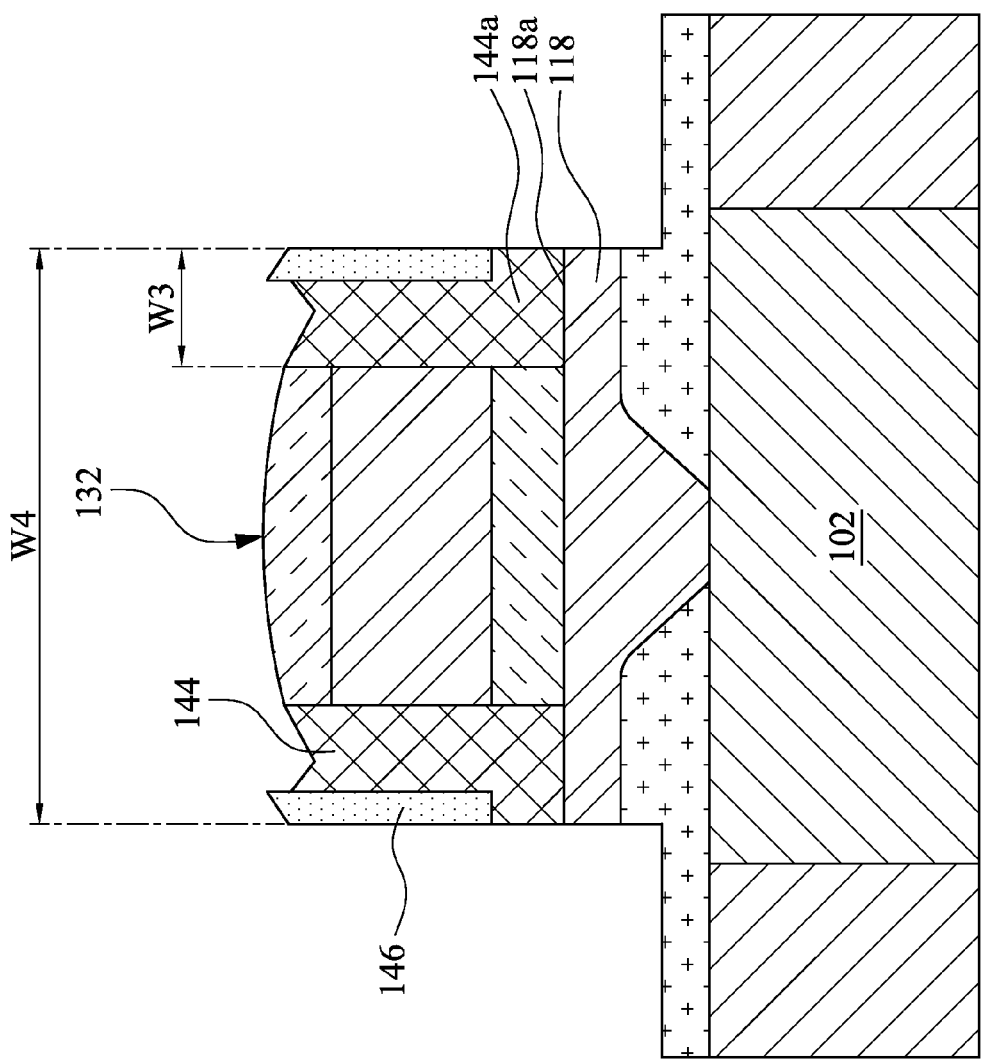

The first electrode layer 116 may be optionally etched so to form the first electrode 118, as shown in FIG. 13, after or during the operation 18 according to some embodiments of the present disclosure. In some examples, the bottom portion 144a of the spacer 144 is positioned on and in contact with the top surface 118a of the first electrode 118. In some examples, the width W3 of the bottom portion 144a of the spacer 144 is approximately 5-30% of the width W4 of the first electrode 118, specifically approximately 10-25% of the width W4.

Figure 14:
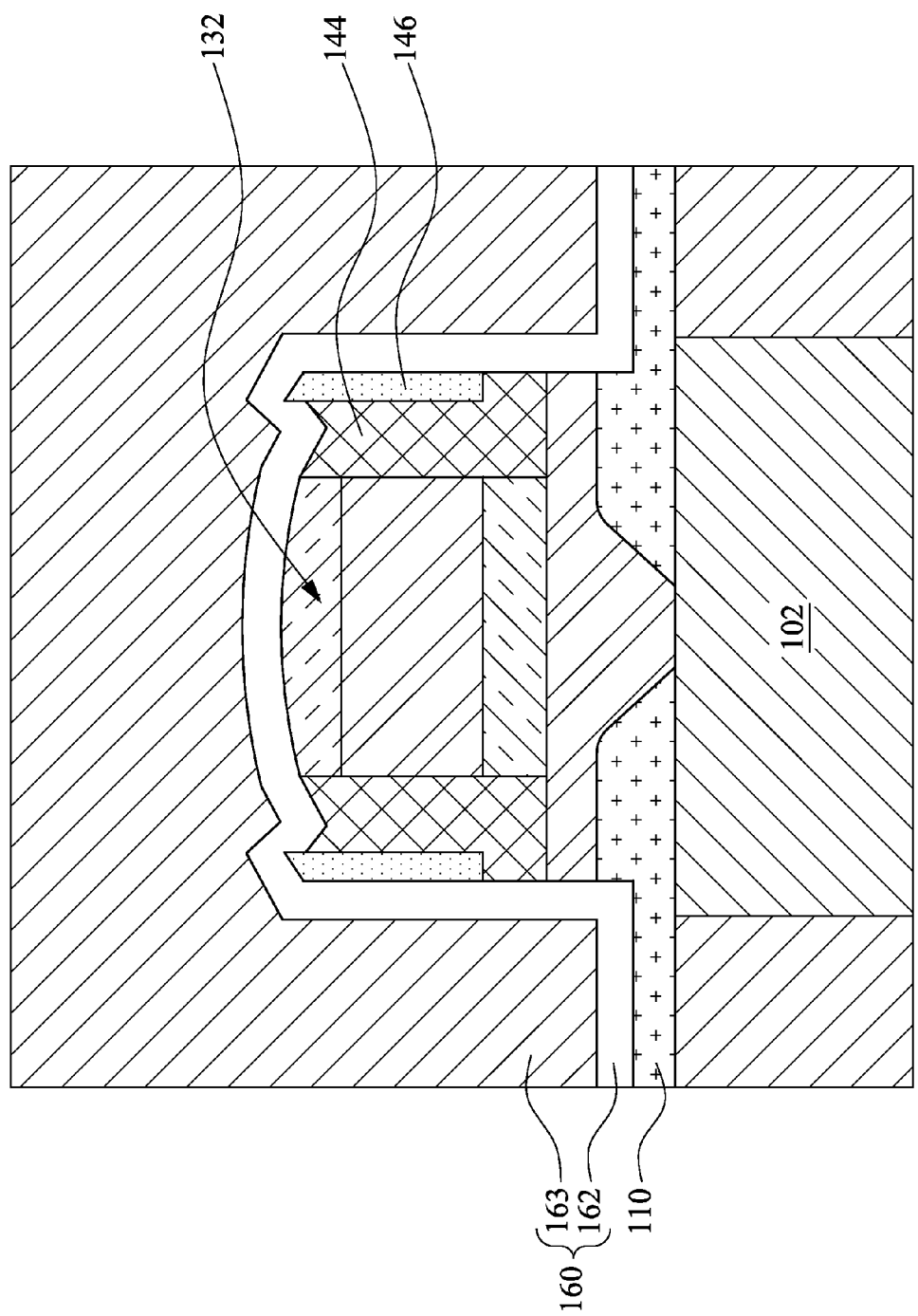

In operation 20, a dielectric layer 160 is formed to cover the stacked feature 132, the spacer 144 and the barrier structure 146, as shown in FIG. 14. In some embodiments, the dielectric layer 160 includes a second dielectric layer 162 and a third dielectric layer 163. The second dielectric layer 162 conformally covers the stacked feature 132, the spacer 144 and the barrier structure 146. The third dielectric layer 163 is deposited on the second dielectric layer 162 and functions as a planarization layer.

Figure 15:
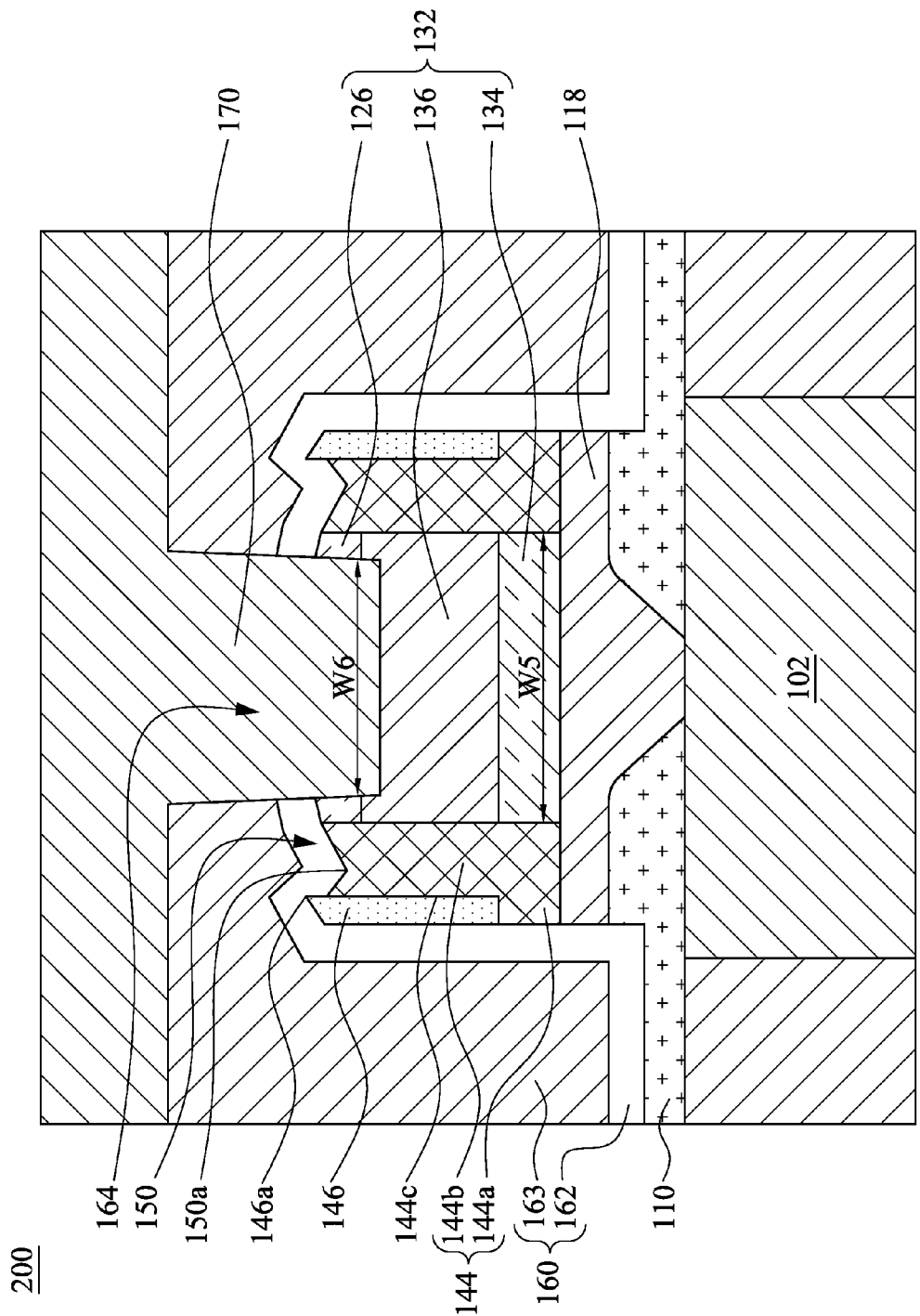

According to various embodiments of the present disclosure, the method 10 may optionally include other operations or acts after the operation 20. As shown in FIG. 15, an opening 164 may be formed in the dielectric layer 160 at a position aligned with the stacked feature 132 such that a portion of the second electrode 136 is exposed. When a part of the patterned mask layer 126 is reminded on the second electrode 136, the opening 164 further passes through the reminded patterned mask layer 126. After the opening 164 is formed, a second conductive via plug 170 is formed in the opening 164 and in contact with the second electrode 136.

As described hereinbefore, some processes in advanced techniques, such as for example Node 40, suffer the misalignment problems. In these advanced techniques, the width W5 of the second electrode 136 (or the storage element 134) is further decreased, and the design rule may render the width W6 of the opening 164 (or the second conductive via plug 170) being greater than 60% of the width W5 of the second electrode 136, so that the misalignment possibility in forming the opening 164 undesirably increases.

Figure 16:
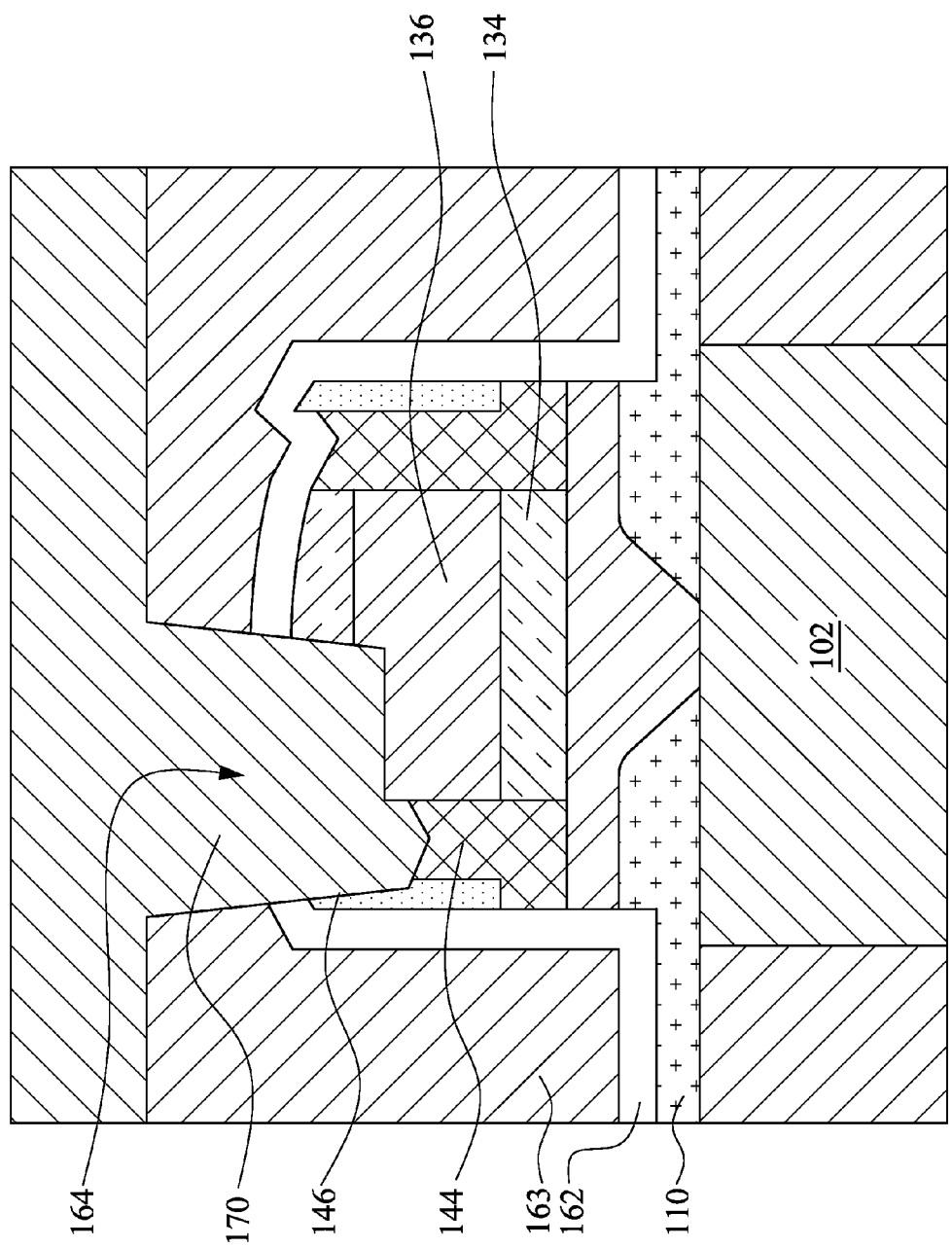
FIG. 16 is a cross-sectional view schematically illustrating a semiconductor device with a misaligned opening according to some embodiments of the present disclosure.

FIG. 16 is a cross-sectional view schematically illustrating a semiconductor device with a misaligned opening 164. When misalignment occurs in the photo process of forming the opening 164, the spacer 144 has an enough thickness to confront the subsequent etching in the area out of the second electrode 136. The remained spacer 144 still provides sufficient isolation or barrier between the follow-up conductive via plug 170 and each of the first electrode 118 and the storage element 134. Therefore, although such misalignment occurs, the semiconductor device is still workable.

According to another aspect of the present disclosure, a semiconductor device such as for example a storage device is provided. FIG. 15 also illustrates a cross-sectional view of a storage device 200 according to various embodiments of the present disclosure. The storage device 200 includes a first electrode 118, a second electrode 136, a storage element 134, a spacer 144 and a barrier structure 146.

The first electrode 118 and the second electrode 136 are opposite to each other. In some embodiments, the second electrode 136 is disposed over the first electrode 118, and the width of the second electrode 136 is smaller than the width of the first electrode 118. In some examples, the first electrode layer 116 may include Ti, Ta, TiN, TaN, or other suitable metals or materials. Similarly, second electrode 136 may include Ti, Ta, TiN, TaN, or other suitable metals or materials.

The storage element 134 is disposed between the first electrode 118 and the second electrode 136. In some embodiments, the storage element 134 includes a free synthetic antiferromagnetic ("SAF") layer, a pinned SAF layer and a tunnel barrier layer interposed there between. In some embodiments, the storage element 134 may include materials used in RRAMs or CBRAMs. For example, the storage material layer 120 may include $Ge_2Sb_2Te_5$, AgInSbTe, NiO, $TiO_2$, $Sr(Zr)TiO_3$, GeS, GeSe, $Cu_2S$, or the like, or a combination thereof.

The spacer 144 is formed on a sidewall of the second electrode 136, and the spacer 144 has a notch 150 positioned on a top surface of the spacer 144. In some embodiments, the spacer 144 is directly attached to both of the sidewalls of the second electrode 136 and the storage element 134. In yet some embodiments, the spacer 144 includes a bottom portion 144a and a standing portion 144b extending upwards from the bottom portion 144a, in which the width W3 of the bottom portion 144a (indicated in FIG. 12) is greater than the width W2 of the standing portion 144b. In some embodiments, the width W3 of the bottom portion 144a of the spacer 144 is approximately 5-30% of the width W4 of the first electrode 118 (indicated in FIG. 13). In some examples, the bottom portion 144a is positioned on and in contact with a top surface 118a of the first electrode 118 (indicated in FIG. 13).

Referring to FIG. 15, the barrier structure 146 is embedded in a lateral 144c of the spacer 144. It is noted that the barrier structure 146 has a top 146a extending upwards past the bottom 150a of the notch 150. In some embodiments, the distance D between the top 146a of the barrier structure 146 and the bottom 150a of the notch 150 defines the depth D of the notch 150, and the depth D of the notch 150 is approximately 3-30% of the height H of the barrier structure 146, as shown in FIG. 12 In some embodiments, the barrier structure 146 stands on the bottom portion 144a of the spacer 144 and further in contact with the lateral 144c of the standing portion 144b. In yet some embodiments, the width W1 of the barrier structure 146 (indicated in FIG. 12) is approximately 5-35% of the width W2 of the standing portion 144b.

According to various embodiments, the storage device 200 further includes a first conductive via plug 102 and a second conductive via plug 170. The first conductive via plug 102 is disposed below the first electrode 118, whereas the second conductive via plug 170 is disposed above the second electrode 136. Further, the first conductive via plug 102 and the second conductive via plug 170 are respectively in contact with the first electrode 118 and the second electrode 136.

In some embodiments, the width W6 of the second conductive via plug 170 is approximately 60-180% of a width W5 of the storage element 134. In some examples, the width W6 of the second conductive via plug 170 is approximately 60-100% of the width W5 of the storage element 134. In yet some examples, the width W6 of the second conductive via plug 170 is approximately 100-180% of a width W5 of the storage element 134.

In accordance with one aspect of some embodiments, a method of forming a storage device includes the following operations: (i) forming a stacked feature including a storage element over a semiconductor substrate; (ii) forming a spacer film covering the stacked feature and the semiconductor substrate; (iii) forming a barrier layer covering the spacer film; (iv) etching the barrier layer and the spacer film by an etchant to form a spacer positioned on a sidewall of the stacked feature and a barrier structure embedded in a lateral of the spacer, in which the barrier layer has an etching resistance to the etchant that is greater than an etching resistance to the etchant of the spacer film; and (v) forming a dielectric layer covering the stacked feature, the spacer and the barrier structure.

In accordance with another aspect of some embodiments, a storage device includes a first electrode, a second electrode, a storage element, a spacer and a barrier structure. The second electrode is opposite to the first electrode. The storage element is disposed between the first electrode and the second electrode. The spacer is formed on a sidewall of the second electrode, and the spacer has a notch positioned on a top surface of the spacer. The barrier structure is embedded in a lateral of the spacer, and the barrier structure has a top extending upwards past a bottom of the notch of the spacer.

In accordance with another aspect of some embodiments, a semiconductor device includes a stacked feature, a spacer and a barrier structure. The stacked feature is formed on a semiconductor substrate, and the stacked feature has a sidewall. The spacer is formed on the sidewall of the stacked feature, and the spacer has a notch positioned on a top surface of the spacer. The barrier structure is embedded in a lateral of the spacer, and the barrier structure has a top extending upwards past a bottom of the notch. A distance between the top of the barrier structure and the bottom of the notch defines a depth of the notch, and the depth of the notch is approximately 5-30% of a height of the barrier structure.

What is claimed is:

1. A method of forming a storage device, comprising:
   forming a stacked feature comprising a storage element over a semiconductor substrate;
   forming a spacer film covering the stacked feature and the semiconductor substrate;
   forming a barrier layer covering the spacer film;
   concurrently etching the barrier layer and the spacer film by an identical etchant to expose a top surface of the stacked feature and to form a spacer positioned on a sidewall of the stacked feature and a barrier structure embedded in a lateral of the spacer, wherein the spacer comprises a notch, the notch of the spacer comprises a surface which is continuous with the top surface of the stacked feature, and the barrier layer has an etching resistance to the etchant that is greater than an etching resistance to the etchant of the spacer film, wherein the barrier structure has a thickness that is approximately 5-35% of a thickness of the spacer; and forming a dielectric layer covering the stacked feature, the spacer and the barrier structure.

2. The method according to claim 1, wherein forming the stacked feature comprising the storage element over the semiconductor substrate comprises:

forming a first conductive via plug over the semiconductor substrate;

forming a first electrode layer in contact with the first conductive via plug; and forming the stacked feature on the first electrode layer, wherein the stacked feature comprising the storage element and a second electrode stacked on the storage element.

3. The method according to claim 2, wherein forming the first electrode layer comprises:

forming a first dielectric layer over the semiconductor substrate, the first dielectric layer having an aperture exposing the first conductive via plug; and forming the first electrode layer covering the first dielectric layer and filling the aperture.

4. The method according to claim 2, wherein forming the stacked feature on the first electrode layer comprises:

forming a storage material layer overlaying the first electrode layer;

forming a second electrode layer overlaying the storage material layer;

forming a patterned mask layer on the second electrode layer; and patterning the storage material layer and the second electrode layer.

5. The method according to claim 1, wherein etching the barrier layer and the spacer film comprises:

forming the notch on a top surface of the spacer; and forming a taper top of the barrier structure.

6. The method according to claim 5, wherein the notch of the spacer has a bottom positioned at a level below the taper top of the barrier structure.

7. The method according to claim 5, wherein a distance between the taper top of the barrier structure and a bottom of the notch defines a depth of the notch, and the depth of the notch is approximately 5-30% of a height of the barrier structure.

8. The method according to claim 1, wherein an etching rate of the etching of the spacer film is at least 8 folds of an etching rate of the etching of the barrier layer.

9. The method according to claim 1, further comprising forming a second conductive via plug in the dielectric layer after forming the dielectric layer.

10. A method of forming a storage device, comprising:
forming a first electrode over a substrate;
forming a stacked feature over the substrate, the stacked feature comprising a storage element and a second electrode over the storage element;
forming a spacer film conformally covering the stacked feature;
forming a barrier layer conformally covering the spacer film;
concurrently etching the barrier layer and the spacer film by an identical etchant to expose a top surface of the stacked feature and to form a spacer positioned on a sidewall of the stacked feature and a barrier structure embedded in a lateral of the spacer, wherein the spacer comprises a notch, the notch of the spacer comprises a surface which is continuous with the top surface of the stacked feature, and the barrier layer has an etching resistance to the etchant that is greater than an etching resistance to the etchant of the spacer film, wherein an etching rate of the etching of the spacer film is at least 8 folds of an etching rate of the etching of the barrier layer; and
forming a dielectric layer covering the stacked feature, the spacer and the barrier structure.

11. The method according to claim 10, wherein etching the barrier layer and the spacer film by the etchant comprises forming the notch on a top surface of the spacer.

12. The method according to claim 11, wherein etching the barrier layer and the spacer film by the etchant comprises forming a taper top of the barrier structure extending upwards past a bottom of the notch.

13. The method according to claim 12, wherein a distance between an end of the taper top and a bottom of the notch defines a depth of the notch, and the depth of the notch is approximately 5-30% of a height of the barrier structure.

14. The method according to claim 10, wherein the spacer is directly attached to the sidewall of the stacked feature.

15. The method according to claim 10, wherein etching the barrier layer and the spacer film by the etchant comprises forming a bottom portion and a standing portion of the spacer, wherein the standing portion extends upwards from the bottom portion, and the bottom portion has a width greater than a width of the standing portion.

16. The method according to claim 15, wherein the bottom portion is in contact with a top surface of the first electrode, and the barrier structure stands on the bottom portion.

17. The method according to claim 16, wherein the barrier structure has a width that is approximately 5-35% of the width of the standing portion.

18. The method according to claim 10, further comprising: forming a conductive via plug in the dielectric layer after forming the dielectric layer.

* * * * *